United States Patent [19]

Chan et al.

[11] Patent Number: 5,798,278
[45] Date of Patent: Aug. 25, 1998

[54] METHOD OF FORMING RAISED SOURCE/ DRAIN REGIONS IN AN INTEGRATED CIRCUIT

[75] Inventors: Tsiu Chiu Chan; Gregory C. Smith, both of Carrollton, Tex.

[73] Assignee: SGS-Thomson Microelectronics, Inc., Carrollton, Tex.

[21] Appl. No.: 681,065

[22] Filed: Jul. 22, 1996

Related U.S. Application Data

[63] Continuation of Ser. No. 331,691, Oct. 31, 1994, abandoned.

[51] Int. Cl.[6] .......................... H01L 21/265; H01L 29/76
[52] U.S. Cl. .......................... 437/43; 437/62; 437/105;
437/200; 437/228; 437/241; 257/344; 257/384;
257/408; 257/412; 257/623; 257/640
[58] Field of Search .......................... 257/67, 344, 384,
257/408, 412; 437/43, 62, 105, 200, 228,
241

[56] References Cited

U.S. PATENT DOCUMENTS

| | | | |
|---|---|---|---|
| 4,868,138 | 9/1989 | Chan et al. | 437/44 |
| 5,182,619 | 1/1993 | Pfiester . | |
| 5,241,193 | 8/1993 | Pfiester et al. . | |
| 5,319,232 | 6/1994 | Pfiester . | |
| 5,365,081 | 11/1994 | Yamakazi et al. . | |

FOREIGN PATENT DOCUMENTS 3636249  10/1986  Germany .

OTHER PUBLICATIONS

U.S. Ser. No. 362,655, Nguyen et al., filed Dec. 1994.
U.S. Ser. No. 361,939, Nguyen et al., filed Dec. 1994.
U.S. Ser. No. 361,760, Nguyen et al., filed Dec. 1994.

Queirolo, et al. "Dopant Activation, Carrier Mobility, and TEM Studies in Polycrystalline Silicon Films", J. Electrochem. Soc., V. 137, No. 3, Mar. 1990, pp. 967–970.

Mark Rodder, "Raised Source/Drain MOSFET with Dual Sidewall Spacers", IEEE Electron Device Letters, 12 1991 Mar., No. 3, New York, US.

Wong, et al. International Electron Devices Meeting, "Elevated Source/Drain MOSFET" pp. 634–637. Dec. 9–12, 1984.

Extended Abstracts/Spring Meeting 88–1 (1988) May 15–20 pp. 301–302.

C.S. Pai, et al. "Chemical Vapor Desposition of Selective Epitaxial Silicon Layers", J. Electrochem. Soc., V. 137, No. 3, Mar. 1990, pp. 971–976.

Primary Examiner—Edward Wojciechowicz
Attorney, Agent, or Firm—Theodore E. Galanthay; Kenneth C. Hill; Lisa K. Jorgenson

[57] ABSTRACT

A method is provided for forming a planar transistor of a semiconductor integrated circuit, and an integrated circuit formed according to the same. A transistor encapsulated in a dielectric is formed over a substrate. First source and drain regions are formed in the substrate adjacent the transistor. Conductive raised second source and drain regions are formed which overly exposed portions of the first substrate source and drain regions adjacent the transistor. The raised second source and drain regions are formed such that an upper surface of the raised second source and drain regions are substantially planar with an upper surface of the transistor. The dielectric encapsulating the transistor electrically isolates the transistor from the raised second source and drain regions.

20 Claims, 3 Drawing Sheets

METHOD OF FORMING RAISED SOURCE/DRAIN REGIONS IN AN INTEGRATED CIRCUIT

This application is a continuation of application Ser. No. 08/331,691, filed Oct. 31, 1994 and now abandoned.

FIELD OF THE INVENTION

The present invention relates generally to semiconductor integrated circuit processing, and more specifically to an improved method of forming planarized transistors by forming raised source and drain regions while reducing junction leakage and preventing shorting conditions.

BACKGROUND OF THE INVENTION

As is well known in the field of integrated circuit design, layout and fabrication, the manufacturing cost of a given integrated circuit is largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions. These geometries and sizes are often dependent upon the photolithographic resolution available for the particular manufacturing facility. The goal of photolithography in establishing the horizontal dimensions of the various devices and circuits is to create a pattern which meets design requirements as well as to correctly align the circuit pattern on the surface of the wafer. As line widths shrink smaller and smaller in submicron photolithography, the process to print lines and contact holes in photoresist becomes increasingly more difficult.

With circuit advancement to the ultra-large-scale integration (ULSI) levels, more and more layers are added to the surface of the wafer. These additional layers in turn create more steps on the wafer surface. The resolution of small image sizes in photolithography thus becomes more difficult over the additional steps because it becomes more difficult due to the increased problem of depth of focus. Planarization techniques become increasingly more important to offset the effects of a varied topography.

The formation of contact structures as transistor dimensions decrease is also important to predict and control device performance. A variety of contact structures have been considered to alleviate various problems such as contact resistance and the maximum area of devices available, such as the areas of source and drain regions, in order to make full contact to the devices with the contact structures. Self-aligned silicides are one alternative for alleviating contact area and resistivity problems associated with contacting source and drain regions. In addition, the self-aligned suicides make the diffused regions more conductive and lowers the sheet resistance of the diffused regions. This self-aligned process is shown with reference to FIGS. 1 and 2. After the transistor 14 is formed having gate oxide 16 and polysilicon or polycide gate electrode 18, the lightly doped drain (LDD) regions 22 are formed by conventional methods by implanting a light dose at the edge of the gate electrode near the channel to overcome such problems as hot-carrier effects. Sidewall oxide spacers 20 are formed along the edge of the gate electrode and gate oxide. The source/drain regions 24 are implanted with a heavier dose to form the source/drain junctions. A metal 26 is deposited over the integrated circuit after which the wafer is heated. The silicon in the source/drain regions 24 then reacts with the metal 26 to form a silicide 28 as shown in FIG. 2. This process is called salicide if the silicide over the source/drain regions is formed at the same time as the suicide 30 over the polysilicon gate electrode. Everywhere there is silicon, the metal will react to form a silicide (the source/drain regions in area 28 and the polysilicon in region 30). Elsewhere the metal remains unreacted and is selectively removed. A dielectric layer is typically formed over the integrated circuit with contact openings formed to the source/drain regions and the polysilicon gate. The openings are generally filled with a metal to make contact to the suicide regions 28 and 30.

The refractory metals including titanium, tungsten, tantalum and cobalt have proven well-suited for use as the metal with which to form the silicide since the reaction with silicon occurs at relatively low processing temperatures, for example, 600° C. or less. There are, however, disadvantages with this process of silicide formation. First, the silicide formation consumes a portion of the substrate silicon thus reducing the integrity of the source/drain regions. Second, titanium is commonly used for the silicide metal because of its low resistivity. However, during titanium disilicide formation, silicon tends to diffuse into the titanium which then may react over top of the sidewall oxide spacers. If silicide is formed over the oxide spacers it is continuous between the silicide formed over the polysilicon gate and the source/drain regions which will cause shorting between the gate electrode and the source/drain regions.

It is therefore an object of the present invention to provide a method of forming a planarized transistor having raised source and drain regions.

It is a further object of the present invention to provide such a method of forming the planarized transistors with raised source and drain regions with reduced resistivity.

It is a further object of the present invention to provide such a method of forming the raised source and drain regions in a manner which reduces junction leakage and reduces shorting between the gate and source/drain regions.

Other objects and advantages of the present invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. A transistor is formed over a substrate having a gate electrode overlying a gate oxide, wherein the transistor is electrically isolated from other devices by a plurality of field oxide regions. A dielectric capping layer is formed over the gate electrode. LDD regions are formed in the substrate adjacent to the gate electrode. Sidewall oxide spacers are formed adjacent to the transistor. Raised conductive source/drain regions are formed adjacent to the sidewall oxide spacers and overlying the exposed LDD regions. The raised source/drain regions are preferably formed to a height above the substrate which is substantially planar with the height of the transistor above the substrate to aid in the planarization of the wafer before subsequent processing steps occur. The raised source/drain regions are preferably formed from selectively grown epitaxial silicon or metal, both of which will aid in reducing punchthrough in the channel under the transistor. If the epitaxial silicon is grown, it is preferable to dope the silicon such that the dopants diffuse into the substrate to form more heavily doped source and drain regions after the epitaxial regions are formed.

BRIEF DESCRIPTION OF THE DRAWINGS

The novel features believed characteristic of the invention are set forth in the appended claims. The invention itself. however. as well as a preferred mode of use. and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 3:
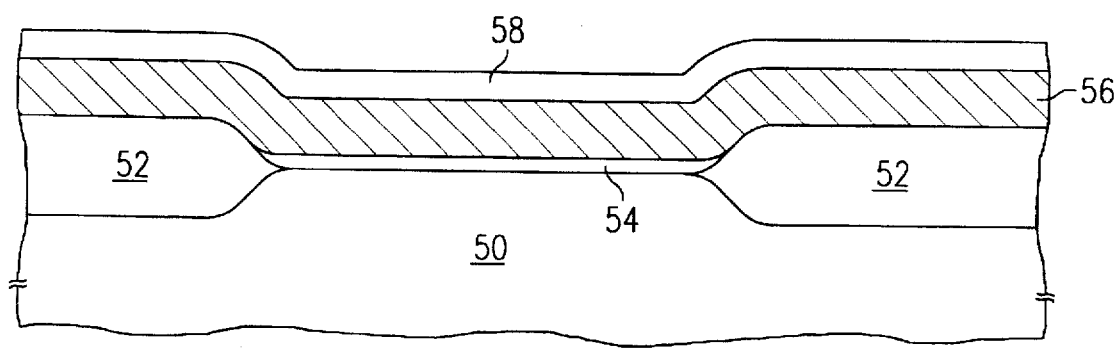
FIGS. 3–6 are cross sectional views of the fabrication of a semiconductor integrated circuit according to one embodiment of the present invention.

Referring now to FIGS. 3–6, a preferred embodiment of the present invention will now be described in detail. FIG. 3 illustrates a portion of a wafer, in cross-section, which has a surface at which isolation structures and devices in adjacent active areas are to be formed. As shown in FIG. 3, an integrated circuit is to be formed on a silicon substrate 50. The silicon substrate may be p- or n- doped silicon depending upon the location in the wafer where the isolation and active devices are to be formed. Field oxide regions 52 are formed on various portions of the wafer to isolate the active areas where devices will be formed. After various conventional processing steps have been performed if necessary to remove any nitride formed under the field oxide regions, such as a sacrificial oxide layer, a gate oxide layer 54 is thermally grown over the silicon substrate 50 to a depth of approximately 20 to 300 angstroms. A polysilicon layer 56 is formed over the oxide layer 54 and field oxide regions 52 to a depth of between approximately 1000–6000 angstroms. A dielectric capping layer 58 such as oxide or nitride is then formed over the polysilicon layer 56 to a depth of between approximately 1000 to 2000 angstroms.

Figure 4:
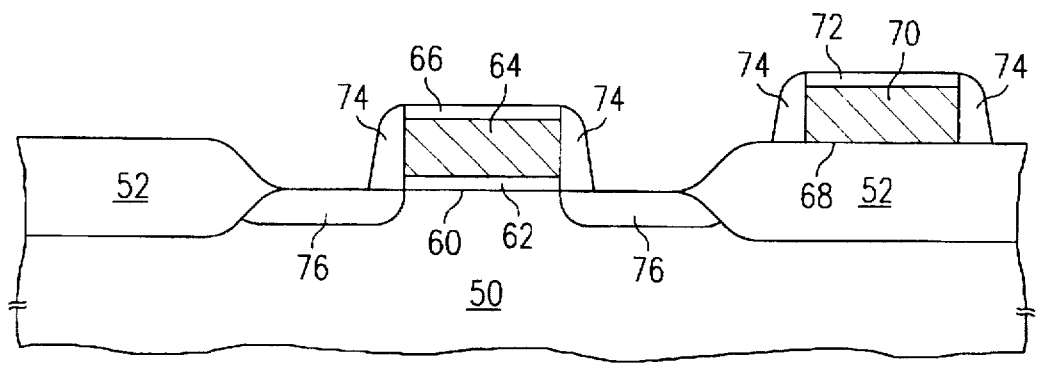

Referring to FIG. 4, the gate oxide 54, polysilicon layer 56 and oxide capping layer 58 are then patterned and etched to form gates of transistors 60 and interconnect lines 68. Transistor 60 comprises gate oxide 62, polysilicon gate electrode 64 and dielectric capping layer 66. Gate electrode 64 may alternatively comprise a silicide of between approximately 1000 to 2000 angstroms overlying the polysilicon layer. The silicide will help to reduce the sheet resistance of the polysilicon gate. Lightly doped drain and source regions 76 are formed, typically with a phosphorous implant in the silicon substrate adjacent to the edge of the gate electrode 64. Sidewall oxide spacers 74 are then formed along the edge of the transistor gate. However, with the capping layer 66 overlying the gate electrode 64, the sidewall spacers 74 will also form along the side of the capping layer 66.

Interconnect 68 is formed over the field oxide region 52 from the same polysilicon layer 56 as that used to form gate electrode 64. After the patterning and etching step, the dielectric capping layer 72 remains over the polysilicon interconnect 70. A silicide may also be formed over the polysilicon underlying the capping layer to reduce the sheet resistance. Sidewall oxide spacers 74 are also formed along the edge of the interconnect 68.

Figure 5:
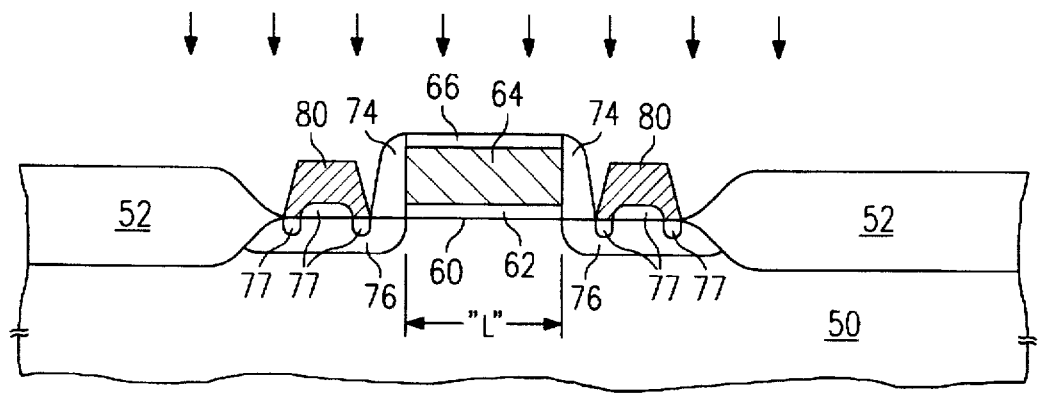

Referring to FIG. 5, only the transistor gate 60 is shown for ease of understanding the present invention. Regions of epitaxy 80 are selectively grown over the source and drain regions 76. As indicated by the article incorporated herein by reference by C. S. Pai et al., titled "Chemical Vapor Deposition of Selective Epitaxial Silicon Layers," J. Electrochem. Soc., Vol. 137, No. 3,March 1990, epitaxial growth of silicon can be selectively deposited on the exposed silicon substrate without deposition occurring on surrounding regions of oxide. In FIG. 5, the growth of the epitaxial silicon 80 will thus be above the source/drain regions 76. The epitaxial regions 80 will form over the source/drain regions 76. While there may some faceting along the sides of the epitaxial region during growth as shown, there may be some lateral formation of the epitaxial regions 80 over the field oxide or sidewall oxide spacers. Any lateral growth is at least partially the result of the upward growth of the epitaxy over the silicon substrate. Preferably, an upper surface of the epitaxial regions will be formed to a height above the silicon substrate substantially planar with an upper surface of the gate electrode 64.

Epitaxial regions 80 will be implanted with an $N^+$ or $P^+$ dopant as shown by the arrows in FIG. 5. The epitaxial regions need to be implanted with sufficient energy and dose to achieve continuity with the LDD implant in the substrate. The dopant atoms will diffuse into the silicon in essentially the same shape as the epitaxial regions 80 to form the $N^+$ or $P^+$ source/drain junctions 77 within at least a portion of regions 76. Typically, the more heavily doped source/drain regions have a deeper junction than the LDD regions as shown by the source/drain regions 24 in FIG. 1. While the same depth may be achieved in the present invention, alternatively, the source/drain regions 77 may have the same or less junction depth in the deepest portion than the LDD regions already formed.

Figure 1:
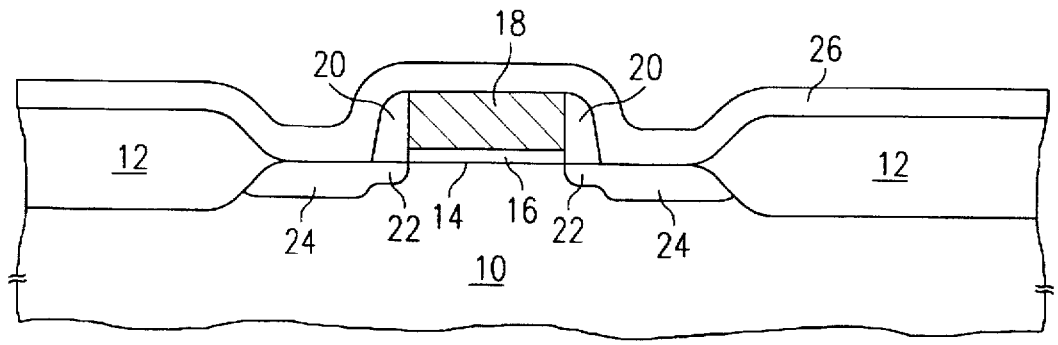
FIGS. 1–2 are cross sectional views of the fabrication of a semiconductor integrated circuit according to the prior art.
Figure 2:
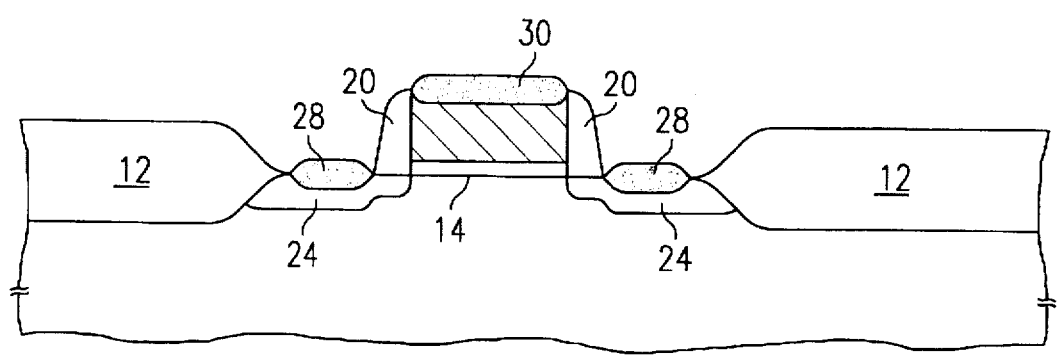

LDD regions may typically form to a depth of approximately 1000 angstroms. In NMOS devices, the dose required for this depth would normally be approximately $1-4 \times 10^{13}$ atoms/cm$^2$ of phosphorous. With a standard source/drain diffusion, as shown in FIG. 1, the second more heavily doped source and drain region junctions are formed to a depth of approximately 1500 angstroms below the silicon surface. In NMOS devices, the implant is typically arsenic at a dose of about $5 \times 10^{15}$ atoms/cm$^2$. The depth of the source and drain regions can be made deeper than the LDD regions without impacting device performance since the more heavily doped source/drain regions are further away from the channel. Using a normal salicide process as shown in FIG. 2, the silicide formation 28 consumes a portion of the source and drain regions 24, approximately 700 angstroms of the 1500 angstroms. If a large enough amount of silicon is consumed, undesired results may be obtained, for example, there may be a low or leaky drain to substrate diode breakdown voltage and the silicide may encroach into the LDD regions effectively reducing the device integrity.

In the present invention, as shown in FIG. 5, the raised source/drain regions 80 formed from selectively growing an epitaxial layer will prevent any lateral diffusion of silicide in the source/drain regions. As the more heavily doped source/drain regions 77 are formed through the epitaxial regions 80, they can be kept to a depth less than or approximately equal to the depth of the LDD. With a shallower source/drain region, the width of the gate, thus the length of the channel "L", may be shortened without adversely affecting device performance. For example, if the standard submicron gate width is 0.5 microns, this process may allow reduction of the gate width to between 0.2 to 0.4 microns. Reducing the gate width has obvious advantages in submicron processing technology such as increasing switching speeds and allowing for a higher packing density of transistors on the chip.

Figure 6:
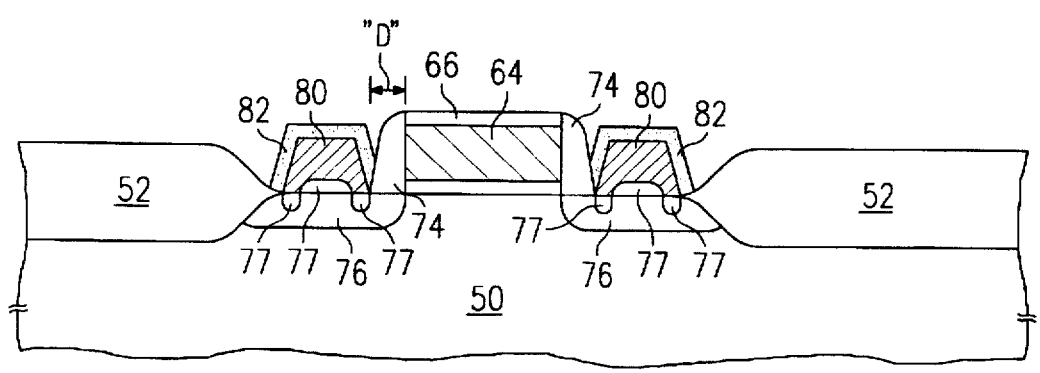

Referring to FIG. 6, a metal layer, such as a refractory metal layer, is formed over the integrated circuit. The wafer is heated to react the metal with the underlying epitaxial silicon in regions 80 to form a silicide 82. Silicide 82 will lower the resistivity of the raised source and drain regions 80. The raised source/drain epitaxial regions 80 will prevent any undesired amount of the substrate silicon from being consumed. The possibility of junction leakage and punchthrough are substantially reduced, with the raised source/drain epitaxial regions 80 substantially planar with the upper portion of the gate electrode 64, the capping layer 66 and sidewall oxide spacers 74 will electrically isolate the raised source and drain epitaxial regions 80 from the gate electrode 64 to prevent shorting between the gate and source/drain regions. A minimum thickness of the capping layer 66 and sidewall oxide spacers 74 needs to be maintained to provide adequate electrical separation as shown by "D" in FIG. 6. The raised epitaxial regions with silicide provide for more thermal stability as compared to a conventional salicide process for subsequent high temperature processing steps.

Figure 7:
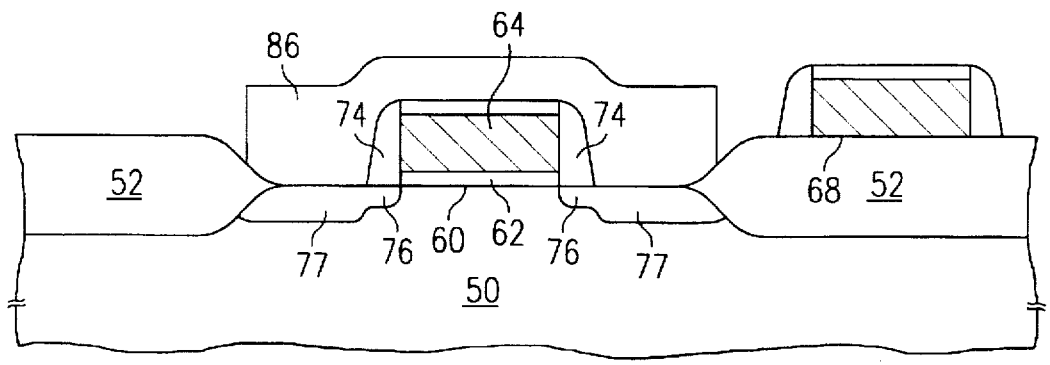
FIGS. 7–8 are cross sectional views of the fabrication of a semiconductor integrated circuit according to a first alternative embodiment of the present invention.
Figure 8:
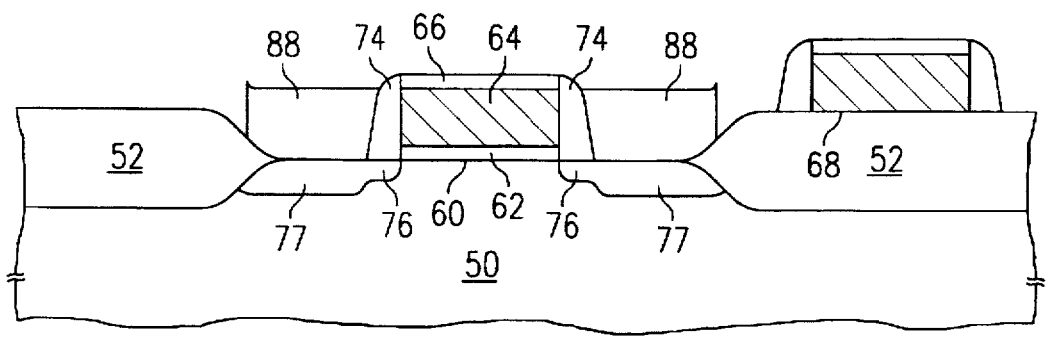

Referring to FIGS. 7-8, a first alternative embodiment is shown. The same reference numerals are used for similar regions as above with reference to FIGS. 3-6. In this embodiment, the $N^+$ or $P^+$ heavily doped source and drain regions 77 are formed by conventional methods after the sidewall oxide spacers are formed and before the raised source/drain regions are formed. The junction of the source/drain regions 77 will typically be deeper than the LDD regions 76 as described above with reference to FIGS. 1 and 2. To form raised souce/drain regions, a suitable metal layer, for example tungsten, is formed over the integrated circuit, preferably to a height greater than the polysilicon stacks which include the transistor 60 and interconnect 68. The metal layer is patterned and etched to form a metal region 86 overlying the transistor 60 and source and drain regions 77.

Referring to FIG. 8, a portion of the metal layer 86 is etched away to form raised source/drain regions 88 overlying the source and drain regions 77 and exposing a portion of the capping layer 66 and sidewall oxide spacers 74. Removal of the metal layer may be by any acceptable method of planarization, for example, reactive ion etching selective to the metal chosen. The metal is preferably etched until the upper portion of the raised source/drain regions 88 is substantially the same height above the silicon substrate as the upper portion of the gate electrode 64. As with the selectively grown epitaxial raised source/drain regions described above, this will provide for a more planar device for subsequent processing steps. In addition, the metal raised source/drain regions will eliminate the need for siliciding the source/drain regions 77 in the substrate, thus reducing the possibility of junction leakage and punchthrough.

Figure 9:
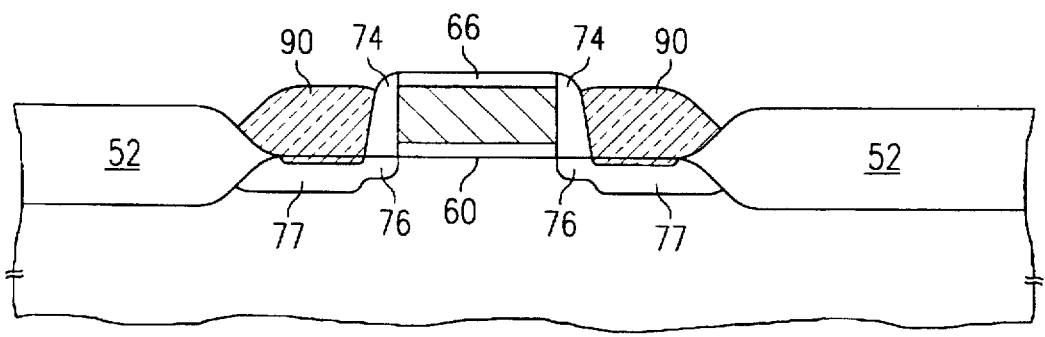
FIG. 9 is a cross sectional view of the fabrication of a semiconductor integrated circuit according to a second alternative embodiment of the present invention.

Referring to FIG. 9, a second alternative embodiment is shown, again with similar reference numerals as those described above for similar regions. In this embodiment, the $N^+$ or $P^+$ heavily doped source and drain regions 77 are formed by conventional methods after the sidewall oxide spacers are formed and before the raised source/drain regions are formed. As with the first alternative embodiment described above with reference to FIG. 7, the junction of the source/drain regions 77 will typically be deeper than the LDD regions 76. Regions of metal 90 are selectively deposited over the source/drain regions 77. The metal is preferably a refractory metal, for example, titanium or tungsten. Selective metal deposition may grow a thin layer of metal silicide over the source/drain regions 77 which may consume a portion of the substrate silicon. While any excessive amount of silicon consumption is not desired, this portion of the selective metal formation acts as a diffusion barrier as the remaining metal continues to be selectively grown over the source/drain regions. The metal regions may be deposited to a height substantially planar with the upper surface of the gate 64 of transistor 60, thus reducing the need for an etch back step. While there may be some faceting with the selectively grown epitaxial regions as described above with reference to the preferred embodiment, the selectively deposited metal will form a more planar upper surface. As with each embodiment described, there needs to be a minimum thickness of the capping layer 66 and sidewall oxide spacers 74 to maintain adequate distance between the raised source and drain regions 90 from the gate electrode 64. This distance will insure the necessary electrical isolation of devices and maintain device integrity.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a semiconductor integrated circuit, comprising the steps of:

forming a transistor over a substrate having a gate electrode overlying a gate oxide, wherein the transistor is electrically isolated by a plurality of field oxide regions;

forming a dielectric capping layer over the gate electrode;

forming LDD regions in the substrate adjacent to the gate electrode after the dielectric capping laver is formed;

forming sidewall oxide spacers adjacent to the gate electrode and capping layer after the LDD regions are formed; and forming planarizing raised metal source/drain regions adjacent to the sidewall oxide spacers and substantially overlying the LDD regions.

2. The method of claim 1, wherein the capping layer comprises oxide.

3. The method of claim 1, wherein the capping layer comprises nitride.

4. The method of claim 1, wherein the formation of the transistor comprises the steps of:

forming an oxide layer over the integrated circuit;

forming polysilicon over the gate oxide; and patterning and etching the polysilicon and oxide layers to form the gate electrode and gate oxide, respectively.

5. The method of claim 4, further comprising the step of:

forming a silicide layer over the polysilicon.

6. The method of claim 1, wherein the height of the transistor above the substrate is approximately 1000–3500 angstroms.

7. The method of claim 4, wherein forming the capping layer further comprises the step of:

forming a dielectric layer to a thickness of approximately 1000–3000 angstroms over the polysilicon layer before the polysilicon is patterned and etched to form the transistor.

8. The method of claim 5 wherein forming the capping layer further comprises the step of:

forming a dielectric layer to a thickness of approximately 1000–3000 angstroms over the silicide layer before the polysilicon and silicide are patterned and etched.

9. The method of claim 1, wherein the transistor gate electrode is between approximately 0.2 to 0.5 microns wide.

10. The method of claim 1, wherein the step of forming a planarizing raised metal source/drain region further comprises the steps of:

selectively growing an epitaxial region adjacent to the sidewall oxide spacers over the exposed silicon substrate; and doping the epitaxial region to form metal raised source/drain regions with sufficient energy and dose to achieve continuity with the LDD implant in the substrate and to form more heavily doped source and drain regions in at least a portion of the LDD regions.

11. The method of claim 10, further comprising the step of:

siliciding an upper portion of the epitaxial region to reduce the resistivity of the epitaxial region.

12. The method of claim 1, wherein the step of forming a planarizing raised metal source/drain region further comprises the steps of:

forming more heavily doped substrate source and drain regions in the substrate after the sidewall oxide spacers are formed;

forming a metal layer over the integrated circuit to a height greater than the capping layer;

patterning and etching the metal layer to remain over the transistor and substrate source and drain regions; and removing the metal layer over the capping layer and a portion of the sidewall oxide spacers.

13. The method of claim 12, wherein the removal of the metal layer comprises reactive ion etching.

14. The method of claim 1, wherein the step of forming a planarizing raised metal source/drain region further, comprises the steps of:

forming more heavily doped substrate source and drain regions in the substrate after the sidewall oxide spacers are formed; and selectively depositing a metal region over the substrate source and drain regions.

15. The method of claim 1, wherein the height of an upper surface of the planarizing raised source/drain regions above the substrate surface is approximately the same as the height of an upper surface of the gate electrode of the transistor above the substrate surface.

16. The method of claim 1, wherein the distance between the planarizing raised metal source/drain regions and the gate electrode is large enough for adequate electrical isolation to prevent shorting between the raised source/drain regions and the gate electrode.

17. A method of forming a portion of a semiconductor integrated circuit, comprising:

forming a gate oxide layer over a substrate within a region electrically isolated by a plurality of field oxide regions;

forming a polysilicon layer on the gate oxide layer;

forming a dielectric capping layer on the polysilicon layer;

patterning the gate oxide layer, the polysilicon layer, and the capping layer to form a gate structure;

after forming the gate structure, forming LDD source/drain regions in the substrate adjacent a region underlying the gate structure;

after forming the LDD source/drain regions, forming sidewall oxide spacers adjacent to the gate structure and over at least a portion of the LDD source/drain regions; and forming planarizing raised conductive source/drain regions adjacent to the sidewall oxide spacers and substantially overlying the LDD regions.

18. The method of claim 17, wherein the step of forming planarizing raised conductive source/drain regions further comprises:

selectively growing an epitaxial layer over at least a portion of the LDD source/drain regions.

19. The method of claim 17, further comprising:

doping the raised conductive source/drain regions and at least a portion of the LDD source/drain regions.

20. The method of claim 17, further comprising:

forming a refractory metal layer over the raised conductive source/drain regions;

heating the integrated circuit to react the metal layer with the raised conductive source/drain regions to form a silicide at an upper surface of each raised conductive source/drain region.

* * * * *